United States Patent [19]

Niki

[11] Patent Number: 5,352,885
[45] Date of Patent: Oct. 4, 1994

[54] FREQUENCY CONVERTER FOR VARYING THE FREQUENCY OF A LOCAL SIGNAL OVER A WIDE BAND

[75] Inventor: Shoji Niki, Saitama, Japan

[73] Assignee: Advantest Corporation, Tokyo, Japan

[21] Appl. No.: 21,985

[22] Filed: Feb. 24, 1993

[30] Foreign Application Priority Data

Mar. 3, 1992 [JP] Japan .................. 4-45200

[51] Int. Cl.⁵ .............................. H01J 40/14
[52] U.S. Cl. ....................... 250/214 R; 359/191
[58] Field of Search ............... 250/214 R; 359/330, 359/326, 191, 192; 307/424; 356/349

[56] References Cited

U.S. PATENT DOCUMENTS

| | | | |
|---|---|---|---|
| 4,156,135 | 5/1979 | Miller et al. | 359/191 |
| 5,140,453 | 8/1992 | Tsushima et al. | 359/192 |

FOREIGN PATENT DOCUMENTS

| | | |
|---|---|---|
| 3706463 | 9/1988 | Fed. Rep. of Germany . |
| 1297922 | 11/1972 | United Kingdom . |
| 2179817 | 3/1987 | United Kingdom . |
| 2225505 | 5/1990 | United Kingdom . |

*Primary Examiner*—David C. Nelms
*Attorney, Agent, or Firm*—Staas & Halsey

[57] ABSTRACT

An input signal of a frequency $f_0$ is supplied to one end of a photodiode. Optical signals of frequencies $F_0$ and $F_0+\Delta F$ from two light sources are combined by a semi-transparent mirror and the resulting interference light is applied to the photodiode. The interference light is converted by the photodiode to an electrical local signal of a frequency $\Delta F$. The electrical local signal and the input signal are frequency mixed in accordance with the nonlinear characteristic of the photodiode and an intermediate-frequency signal of a frequency corresponding to the frequency difference between them is provided at an output terminal.

5 Claims, 2 Drawing Sheets

FREQUENCY CONVERTER FOR VARYING THE FREQUENCY OF A LOCAL SIGNAL OVER A WIDE BAND

BACKGROUND OF THE INVENTION

The present invention relates to a frequency converter which is suitable for converting high-frequency signals, such as micro-waves, into intermediate-frequency signals over a wide band.

FIG. 1 shows a conventional frequency converter. An input signal from an input terminal 11 is supplied via a directional coupler 12 to one end of a mixer diode 13. The directional coupler 12 is supplied with a local signal of a local oscillator 15 from a terminal 14 and the local signal is applied to the mixer diode 13. The other end of the mixer diode 13 is grounded via a capacitor 16 acting as a high-frequency signal path and, at the same time, it is connected to an output terminal 17.

Thus, the input signal from the terminal 11 and the local signal from the terminal 14 are provided via the directional coupler 12 to the mixer diode 13, from which a component of the frequency difference between the both signals, obtained owing to the nonlinearity of the mixer diode 13, is provided as an intermediate-frequency signal to the output terminal 17.

Since the input signal and the local signal are applied via the directional coupler 12 to the mixer diode 13, they are restricted by the frequency characteristics of the paths from the input terminal 11 to the junction of the mixer diode 13 and from the terminal 14 to the junction of the mixer diode 13 and it is difficult to operate the conventional frequency converter over a wide band.

It is also difficult to construct the prior art frequency converter so that the local oscillator 15 is capable of varying a high-frequency local signal over a wide band.

SUMMARY OF THE INVENTION

It is therefore an object of the present invention to provide a frequency converter which is able to operate over a wide band and capable of varying the frequency of a local signal over a wide band.

According to the present invention, an input signal is supplied to a photodetector which has a nonlinear characteristic such as obtainable with a PN junction, and two optical signals of different wave-lengths are simultaneously applied to the photodetector, from which a frequency converted output is taken out. The frequencies of the two optical signals are selected such that the frequency difference therebetween is the frequency of the local signal.

DESCRIPTION OF THE PREFERRED EMBODIMENTS

Figure 1:
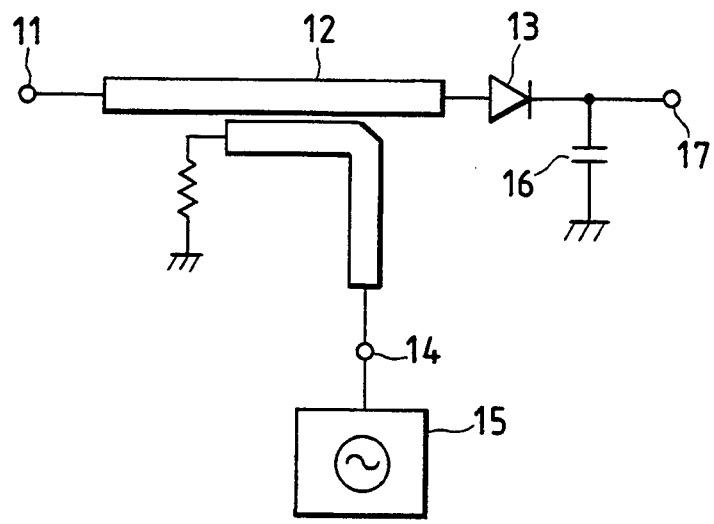
FIG. 1 is a diagram schematically showing a conventional frequency converter.
Figure 2:
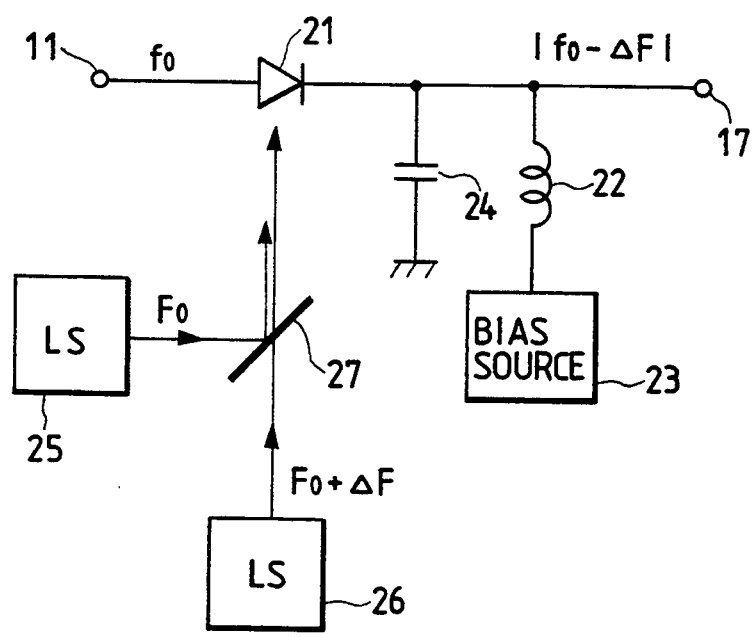
FIG. 2 is a diagram illustrating an embodiment of the frequency converter according to the present invention.

FIG. 2 illustrates a first embodiment of the present invention. In this embodiment, an input signal from the input terminal 11 is applied to one end of a photodiode 21 acting as a photodetector, the other end of which is connected to a bias power supply 23 via a high frequency blocking coil 22, grounded via a high frequency passage capacitor 22 and connected to the output terminal 17. An optical signal of a frequency $F_0$ from a light source 25 such as a laser diode and an optical signal of a frequency $F_0 + \Delta F$ from a light source 26 such as a laser diode are combined by light combining means 27 such as a semitransparent mirror, and the resulting interference light is applied to the photodiode 21.

The interference light is converted by the photodiode 21 to an electrical signal, which indicates variations in the amplitude (or intensity) of the interference light and has a frequency $F_0 + \Delta F - F_0 = \Delta F$. This electrical signal acts as a local signal with respect to the input signal from the input terminal 11, and owing to the nonlinearity of the photodiode 21, an intermediate-frequency signal of a frequency $|f_0 - \Delta F|$ which is the difference between the frequency $\Delta F$ of the above-mentioned electrical signal and the frequency $f_0$ of the input signal is provided at the output terminal 17. Incidentally, the high-frequency component is grounded via the capacitor 24. For instance, the frequency $F_0$ is set at 200 THz ($\lambda = 1.5$ μm), the frequency $\Delta F$ a maximum of 100 GHz and the frequency $f_0$ a maximum of 100 GHz.

Figure 3:
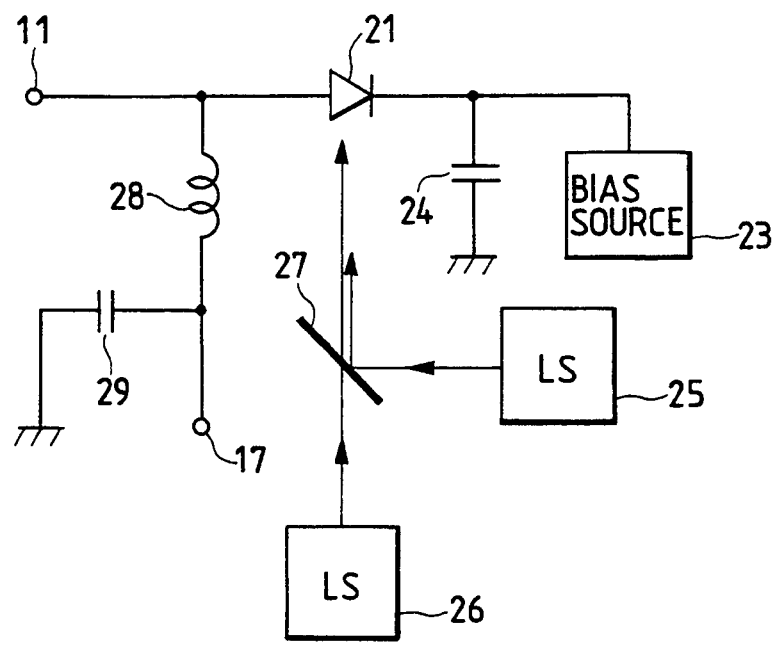
FIG. 3 is a diagram illustrating another embodiment of the present invention.

While in the FIG. 2 embodiment the input terminal 11 and the output terminal 17 are connected to the both ends of the photodiode 21, the output terminal 17 may also be provided at the same side as the input terminal 11. That is, as shown in FIG. 3 wherein the parts corresponding to those in FIG. 2 are identified by the same reference numerals, the output terminal 17 is connected via a high frequency blocking coil 28 to the connection point of the input terminal 11 and the photodiode 21. If necessary, the output terminal 17 is grounded via a capacitor 29 as a high frequency path.

Figure 4:
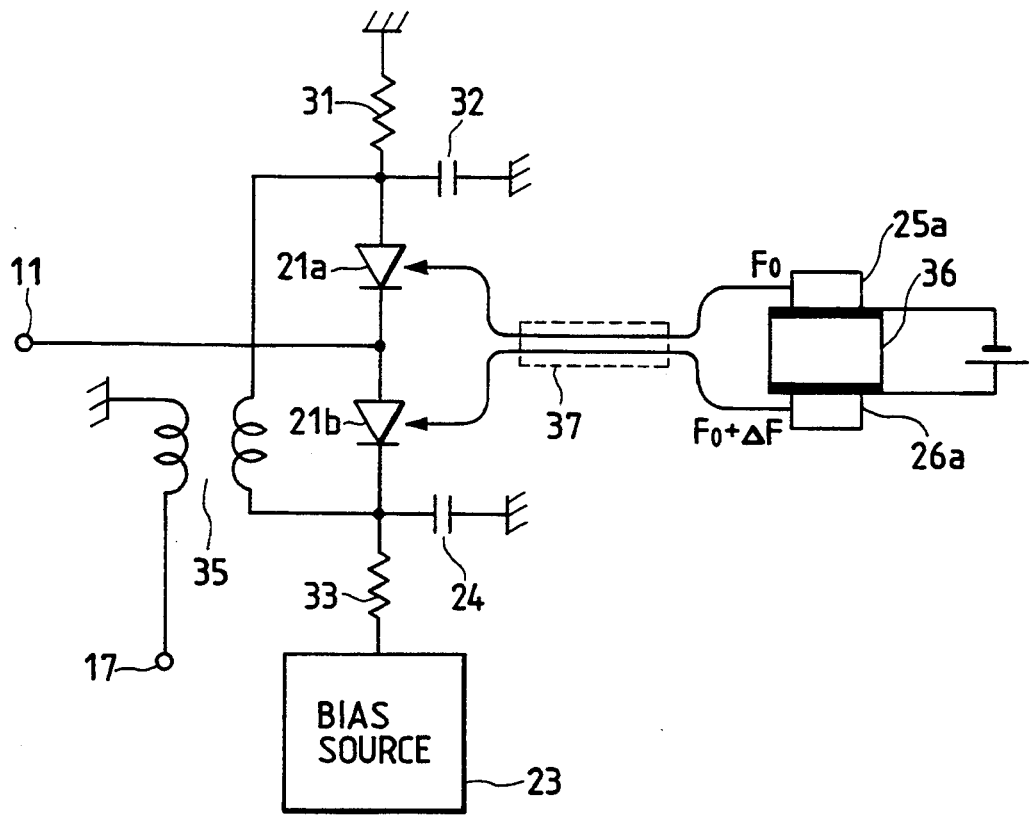
FIG. 4 is a diagram illustrating still another embodiment of the present invention.

FIG. 4 illustrates another embodiment of the present invention which is constructed as a balanced frequency converter. Photodiodes 21a and 21b are connected in series in the forward direction, one end of the series connection is grounded via a resistor 31 and grounded via capacitor 32 serving as a high frequency path, and the other end is connected via a resistor 33 to the bias source 23 and grounded via the capacitor 24 serving as a high frequency path. The input terminal 11 is connected to the connection point of the photodiodes 21a and 21b. An output transformer 35 has its primary side connected across the series connection of the photodiodes 21a and 21b, and the output terminal 17 is connected to one end of the secondary side of the output transformer 35, the other end being grounded.

A laser diode 25a as the light source 25 and a laser diode 26a as the light source 26 are mounted on low-temperature and high-temperature sides of a Peltier element 36, respectively. In the case where the laser diodes 25a and 26a are those of the same characteristics, for example, and their temperature difference is 10° C., the frequency difference $\Delta F$ between their optical outputs is about 100 GHz. The optical signals from the laser diodes 25a and 26a are combined by an optical coupler 37 and the resulting interference light is applied to each of the photodiodes 21a and 21b.

The interference light applied to each of the photodiodes 21a and 21b is converted to an electrical signal, which functions as a local signal with respect to the input signal in each photodiode, generating an intermediate-frequency signal of a frequency corresponding to the frequency difference between the input signal and the local signal, $|f_0-\Delta F|$. The intermediate-frequency signals thus produced are combined by the output transformer 35. In this instance, since the plus side and minus side of the input signal act in such a manner as to compensate its distortion, an intermediate-frequency signal with a small distortion is obtained at the output terminal 17 Furthermore, input signal components are cancelled each other and do not appear at the output terminal 17.

By controlling the current which is applied to the Peltier element 36, it is possible to sweep the temperature difference between the laser diodes 25a and 26a to sweep the frequency $\Delta F$ of the local signal.

In the embodiments described above, the photodiodes may be replaced with phototransistors.

As described above, according to the present invention, since two optical signals are applied to a photodetector and the input signal is also provided to the photodetector, there is provided the same state as that in which the input signal and the local signals are applied directly to the photodetector, and no restrictions are imposed on the frequency characteristic of the input signal from the input end to the junction of the photodetector and the frequency characteristics of the local signals to the junction of the photodetector. Hence the frequency converter according to the present invention is capable of operating over a wide band. Moreover, the frequency of the local signal can be varied over a wide range, since it is the frequency corresponding to the frequency difference between the two optical signals.

It will be apparent that many modifications and variations may be effected without departing from the scope of the novel concepts of the present invention.

What is claimed is:

1. A frequency converter comprising:
    an electrical input terminal for receiving an input electrical signal having a frequency $f_0$;
    photodetector means, connected to said electrical input terminal, for receiving said input electrical signal, said photodetector means having a nonlinear characteristic;
    local light source means for simultaneously applying two optical signals having different frequencies $F_0$ and $F_0+\Delta F$ to said photodetector means; and
    signal extracting means for electrically extracting an electrical intermediate frequency signal from said photodetector means, the electrical intermediate-frequency signal having a frequency which is the difference between the frequency $f_0$ of said input electrical signal and a frequency difference $\Delta F$ between said two optical signals.

2. The frequency converter of claim 1, wherein said signal extracting means includes filter means connected to said photodetector means at a side opposite said input terminal, for grounding a high-frequency component.

3. The frequency converter of claim 1, wherein said signal extracting means includes filter means connected to said photodetector means on the same side as said input terminal, for grounding a high-frequency component.

4. The frequency converter of claim 1, wherein said photodetector means includes two photodetectors connected in series in the forward direction;
    wherein said signal extracting means includes:
        filter means connected between both ends of the series connection of said two photodetectors and ground, for grounding a high-frequency component; and
    an output transformer having a primary coil connected between both ends of the series connection of said two photodetectors, for outputting a frequency-converted signal to a secondary coil; and
    wherein said input terminal is connected to the connection point of said two photodetectors.

5. The frequency converter of claim 4, wherein said local light source means includes:
    Peltier element means having a heat absorbing face and a heat radiating face;
    two laser diodes mounted on the heat-absorbing face and the heat-radiating face of said Peltier element means, respectively, for outputting said optical signals; and
    optical coupler means for combining said two optical signals into interference light and for applying said interference light to each of said two photodetectors.

* * * * *